(12) United States Patent
Morgner et al.

(10) Patent No.: US 9,419,559 B2
(45) Date of Patent: Aug. 16, 2016

(54) PARAMETRIC OSCILLATOR AND METHOD FOR GENERATING ULTRA-SHORT PULSES

(75) Inventors: Uwe Morgner, Berenbostel (DE); Stefan Rausch, Hannover (DE); Thomas Binhammer, Hannover (DE)

(73) Assignee: Gottfried Wilhelm Leibniz Universitat Hannover, Hannover (DE)

( * ) Notice: Subject to any disclaimer, the term of this patent is extended or adjusted under 35 U.S.C. 154(b) by 696 days.

(21) Appl. No.: 13/642,618

(22) PCT Filed: Apr. 18, 2011

(86) PCT No.: PCT/EP2011/001963
§ 371 (c)(1),
(2), (4) Date: Feb. 1, 2013

(87) PCT Pub. No.: WO2011/131332
PCT Pub. Date: Oct. 27, 2011

(65) Prior Publication Data
US 2013/0127553 A1 May 23, 2013

(30) Foreign Application Priority Data
Apr. 23, 2010 (DE) .......................... 10 2010 018 035

(51) Int. Cl.
*G02F 1/39* (2006.01)
*H03B 17/00* (2006.01)
*G02F 1/35* (2006.01)

(52) U.S. Cl.
CPC *H03B 17/00* (2013.01); *G02F 1/39* (2013.01); *G02F 2001/3542* (2013.01); *G02F 2001/392* (2013.01)

(58) Field of Classification Search
None
See application file for complete search history.

(56) References Cited

U.S. PATENT DOCUMENTS

| 5,296,960 | A | | 3/1994 | Ellingson | |
|---|---|---|---|---|---|
| 5,365,366 | A | * | 11/1994 | Kafka et al. | .................. 359/330 |

(Continued)

FOREIGN PATENT DOCUMENTS

| DE | 19907722 | 8/1999 |
|---|---|---|
| DE | 69802122 | 3/2002 |

(Continued)

OTHER PUBLICATIONS

International Search Report mailed Jul. 22, 2011 for PCT/EP2011/001963 (3 pages).

(Continued)

*Primary Examiner* — Hemang Sanghavi
(74) *Attorney, Agent, or Firm* — Reza Mollaaghababa; Thomas J. Engellenner; Pepper Hamilton LLP

(57) ABSTRACT

The invention relates to a parametric oscillator (1) for generating ultra-short pulses. The system (1) comprises a resonator (10) having an optical axis (11), an amplifier crystal (9) arranged in the resonator (10), and a pump laser system (4) for generating pump laser radiation (5) comprising pump photons, said pump laser radiation being directed onto the amplifier crystal (9). The invention is characterized in that the amplifier crystal (9) is an optically non-linear crystal configured for generating a signal photon and an idler photon from a pump photon by means of an optical-parametric process, wherein the resonator (10) is arranged in such a way that a signal pulse formed from the signal photons leaves the amplifier crystal (9) along the optical axis (11) of the resonator (10), and wherein dispersion compensation members for at least partially compensating the dispersion of the radiation circulating in the resonator (10) are provided. The invention also relates to a method for generating ultra-short pulses or the associated mode comb by means of such a parametric oscillator (1).

16 Claims, 1 Drawing Sheet

(56) References Cited

U.S. PATENT DOCUMENTS

| | | | |
|---|---|---|---|
| 6,320,886 | B1 | 11/2001 | Dawber |
| 6,363,090 | B1 | 3/2002 | Wintner |
| 2002/0048078 | A1* | 4/2002 | Schiller ............ G02F 1/39 359/330 |
| 2009/0066963 | A1* | 3/2009 | Petek et al. ............ 356/450 |
| 2009/0168148 | A1 | 7/2009 | Kondo |
| 2010/0060976 | A1 | 3/2010 | Ebrahim-Zadeh |
| 2011/0058248 | A1* | 3/2011 | Vodopyanov et al. ........ 359/330 |
| 2011/0180729 | A1 | 7/2011 | Kafka |
| 2011/0273763 | A1* | 11/2011 | Kaertner et al. ........... 359/330 |

FOREIGN PATENT DOCUMENTS

| | | |
|---|---|---|
| DE | 69714859 | 4/2003 |
| DE | 102008005129 | 5/2009 |
| EP | 0857997 | 8/1998 |

OTHER PUBLICATIONS

International Preliminary Report on Patentability dated Oct. 23, 2012 for PCT/EP2011/001963 (8 pages).

Laenen et al. "Evidence for chirp reversal and self-compression in a femtosecond optical parametric oscillator," J. Opt. Soc. Am., 8(5):1085-88 (1991).

Zhu et al., "Synchronously Pumped Femtosecond Optical Parametric Oscillator Based on MgO-Doped Periodically Poled LiNbO3," Chin. Phys. Lett., 24(9)2603-05 (2007).

Zhong et al., "Synchronously pumped femtosecond parametric oscillator at 1053 nm," Sci China Ser G-Phys Mech Astron, 52(8):1187-90 (2009).

Gale, G. M., et al., "Sub-20-fs tunable pulses in the visible from an 82-MHz optical parametric oscillator," Optics Letters, vol 20, No. 14, Jul. 15, 1995, pp. 1562-1564.

Gale, G. M., et al., "Femtosecond visible optical parametric oscillator," J. Optical Society of America, vol. 15, No. 2, Feb. 1998, pp. 702-714.

Driscoll, T.J., et al., "Ti:sapphire second-harmonic-pumped visible range femtosecond optical parametric oscillator," Optics Communications 110 (1994) pp. 638-644.

Sun, Jinghua, et al., "Coherent synthesis using carrier-envelope phase-controlled pulses from a dual-color femtosecond optical parametric oscillator," Optics Letters, vol. 32, No. 11, Jun. 1, 2007, pp. 1396-1013.

Schibli, Thomas R., et al., "Toward single-cycle laser systems," IEEE Journal of Selected Topics in Quantum Electronics, vol. 9, No. 4, Jul./Aug. 2003, pp. 990-1001.

Ell, R., et al., "Generation of 5-fs pulses and octave-spanning spectra directly from a Ti:sapphire laser," Optics Letters, Mar. 15, 2001, vol. 26, No. 6, pp. 373-375.

Fortier, T. M., et al., "Octave-spanning Ti:sapphire laser with a repetition rate >1 GHz for optical frequency measurements and comparisons," Optics Letters, Apr. 1, 2006, vol., 31, No. 7, pp. 1011-1013.

Rausch, Stefan et al., "Controlled waveforms on the single-cycle scale from a femtosecond oscillator," Optics Express, Jun. 23, 2008, vol. 16, No. 13, pp. 9739-9745.

Spielmann, Ch., et al., "Femtosecond pulse generation from a synchronously pumped Ti:sapphire laser," Optics Letters, vol. 16, No. 15, Aug. 1, 1991, pp. 1180-1182.

Seitz, W., et al., "Passive synchronization of two independent laser oscillators with a Fabry-Perot modulator," Optics Letters, vol. 27, No. 6, Mar. 15, 2002, pp. 454-456.

Ell, Richard et al., "Quasi-synchronous pumping of modelocked few-cycle Titanium Sapphire lasers," Optics Express, vol. 13, No. 23, Nov. 14, 2005, pp. 9292-9298.

Cerullo, G., et al., "Self-starting Kerr-lens mode locking of a Ti:sapphire laser," Optics Letters, vol. 19, No. 14, Jul. 15, 1994, pp. 1040-1042.

Cerullo, Giulio et al., "Generation of 11 fs pulses tunable across the visible by optical parametric amplification," Applied Physics Letters, vol. 71, No. 25, Dec. 22, 1997, pp. 3616-3618.

Shirakawa, A., et al., "Sub-5-fs visible pulse generation by pulse-front-matched noncollinear optical parametric amplification," Applied Physics Letters, vol. 74, No. 16, Apr. 19, 1999, pp. 2268-2270.

Baltuska Andrius et al., "Visible pulse compression to 4 fs by optical parametric amplification and programmable dispersion control," Optics Letters, vol. 27, No. 5, Mar. 1, 2002, pp. 306-308.

Cirmi, G., et al., "Carrier-envelope phase stable, few-optical-cycle pulses tunable from visible to near IR," J. Opt. Soc. Am. B., vol. 25, No. 7, Jul. 2008, pp. B62-B69.

Schriever, Christian et al., "Tunable pulses from below 300 to 970 nm with durations down to 14 fs based on a 2 MHz ytterbium-doped fiber system," Optics Letters, vol. 33, No. 2, Jan. 15, 2008, pp. 192-194.

Rothhardt, J., et al., "High repetition rate fiber amplifier pumped sub-20 fs optical parametric amplifier," Optics Express, vol. 15, No. 25, Dec. 10, 2007, pp. 16729-16736.

Steinmann Andy et al., "Generation of few-cycle pulses directly from a MHz-NOPA," Optics Express, vol. 14, No. 22, Oct. 30, 2006, pp. 10627-10630.

European Notification Summoned to Oral Proceedings in German dated Feb. 19, 2014 (13 sheets).

Morgner, U., et al., "Ultrabroadband double-chirped mirror pairs covering one octave of bandwidth," CLEO 2000, Thursday Morning, CThE5 9:15 am, pp. 412.

\* cited by examiner

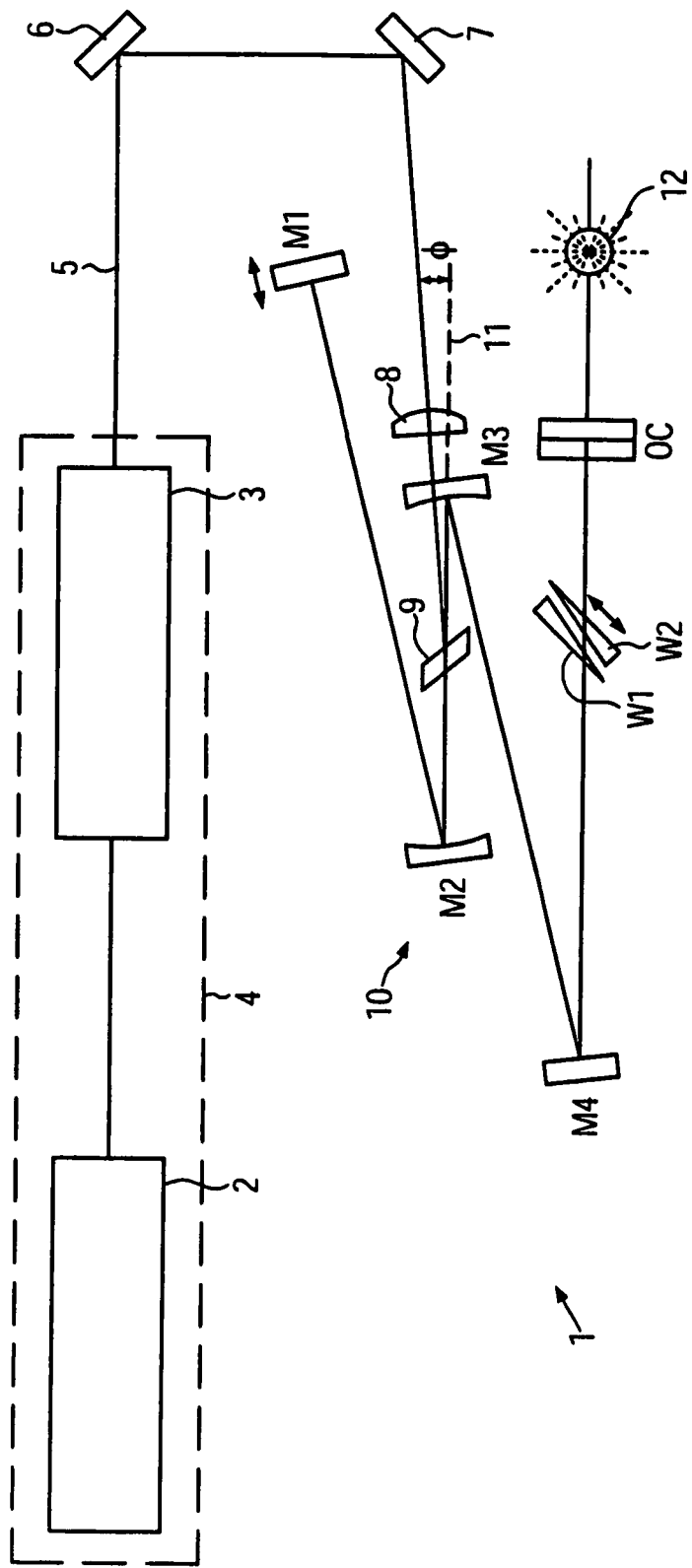

PARAMETRIC OSCILLATOR AND METHOD FOR GENERATING ULTRA-SHORT PULSES

The invention relates to a parametric oscillator according to the preamble of claim 1, and to a corresponding method for generating ultra-short laser pulses.

Ultra-short laser pulses, also referred to as femtosecond pulses, have a duration (FWHM) of less than 1 picosecond. A typical pulse duration of an ultra-short pulse laser is therefore e.g. in the order of 100 to 200 femtoseconds (fs). A laser system of the type in question is disclosed by DE 199 07 722 A1.

As described in this publication, ultra-short laser pulses are typically generated by means of a laser-active crystal with a high amplification bandwidth in a resonator. In the laser-active crystal, an inversion is created by pumping, e.g. by pump laser radiation. By means of mode locking of the radiation emitted from the laser crystal through stimulated emission, ultra-short laser pulses are generated, which circulate in the resonator. Dispersion compensation members in the resonator compensate the dispersion of the laser pulses occurring when the latter travel through the laser crystal, so as to prevent an extension of the pulse duration. Ti-sapphire (Ti:Sa, $Ti^{3+}$:$Al_2O_3$) is often used as a laser-active crystal with a high amplification bandwidth.

Conventional methods and laser systems for generating ultra-short pulses are disadvantageous e.g. insofar as the operation of these laser systems is failure prone, as they can only be used for achieving comparatively moderate average laser powers, and as the available wavelength ranges of the ultra-short laser pulses are limited due to the emission bandwidth of the laser crystals.

It is the object of the present invention to provide, with the aid of means having the simplest possible structural design, a laser system and a method for generating ultra-short laser pulses, by means of which one or a plurality of the above-mentioned disadvantages are avoided.

According to the present invention, this object is achieved by a parametric oscillator having the features of claim 1 and by a method of generating ultra-short pulses having the features of claim 10. Advantageous further developments of the invention are disclosed in the subclaims.

In the parametric oscillator according to the present invention, the laser crystal used in the resonator is an optically non-linear crystal configured for generating a signal photon and an idler photon from a pump photon by means of an optical parametric process. A crystal is optically non-linear, when it has a non-linear, i.e. intensity-dependent, polarizability or susceptibility. Due to its optical non-linearity, the amplifier crystal is capable of allowing an optical parametric process to take place, in which signal radiation and idler radiation is generated from the pump laser radiation through non-linear three-wave interaction.

According to the present invention, the resonator is arranged in such a way that a signal pulse formed from the signal photons (and/or an idler pulse formed from the idler photons) leave(s) the amplifier crystal along the optical axis of the resonator. This has the effect that the signal radiation (and/or the idler radiation) is/are coupled back like in an optical parametric oscillator (OPO), so that the radiation circulating in the resonator can be amplified still further whenever it passes through the amplifier crystal subsequently.

The advantage of the parametric oscillator according to the present invention is to be seen in the fact that it can be used for generating very short pulse durations (in the range of a few femtoseconds up to a few ten femtoseconds) in combination with average laser powers that are higher than those achieved in the hitherto used systems. A substantial advantage is additionally accomplished insofar as the wavelengths of the ultra-short laser pulses are no longer limited by the emission bandwidth of the laser-active crystal. Depending on the selection and orientation of the amplifier crystal, it is now possible to provide almost arbitrary wavelengths.

A crystal that is suitable for being used as an optically non-linear amplifier crystal with a high amplification bandwidth is e.g. a barium beta borate crystal (BBO crystal) or a periodically or aperiodically poled crystal, e.g. a periodically or aperiodically (e.g. "chirped") lithium niobate crystal. Another expedient alternative is a crystal which is operated at or close to the degeneration point. A crystal is operated at the degeneration point, when the wavelengths of the signal radiation and of the idler radiation are identical in the optical parametric process.

In order to allow the signal beam to be returned in the resonator, the phase matching condition between the pump wave, the signal wave and the idler wave ($k_p = k_s + k_i$) must be fulfilled at the amplifier crystal in the optical parametric process. The phase matching angle between the pump laser radiation and the signal radiation depends on the amplifier crystal used. In order to achieve phase matching, it may be of advantage when the pump laser radiation is directed onto the amplifier crystal non-collinearly to the optical axis of the resonator. In the case of BBO the internal phase matching angle is e.g. 2.4°. When the pump laser radiation is directed onto the amplifier crystal at this angle to the optical axis, the phase matching condition is fulfilled in the best possible way.

According to an advantageous embodiment the pump laser system comprises a pump laser and a frequency conversion stage, e.g. a frequency doubler stage. In this way, the pump laser radiation will be provided with photons of higher energy so that also the signal radiation generated by the optical parametric process will comprise photons of higher energy. By means of the frequency conversion stage it can additionally be accomplished that the pump laser radiation lies in a wavelength range in which the non-linear susceptibility of the amplifier crystal is particularly high, so that the efficiency of the optical parametric process will be particularly high as well.

The pump laser radiation preferably is a pulsed laser radiation, and consists e.g. of ultra-short laser pulses. High peak intensities can thus be achieved so as to increase the efficiency of the optical parametric process.

When the pump laser radiation is a pulsed laser radiation, the optical length of the resonator should be chosen such that the circulating time of the signal pulse in the resonator (or an integer multiple of this circulating time) corresponds as precisely as possible to the time interval between two pulses of the pump laser radiation. It is thus achieved that, after having circulated in the resonator once or more than once, the signal pulse will again be precisely superimposed with a pump pulse. The optical parametric process caused by the new pump pulse in the amplifier crystal now amplifies the signal pulse circulating in the resonator. In addition, the efficiency of the optical parametric process is increased, since the process can originate from the signal pulse and need no longer start from the noise.

The dispersion compensation member or members for at least partially compensating, as far as possible, however, fully compensating the dispersion of the radiation circulating in the resonator may e.g. be a pair of optical wedges, a pair of prisms and/or one or a plurality of dispersion-compensating mirrors. Pairs of optical wedges or prisms are advantageous insofar as, depending on their position relative to one another, the degree of dispersion compensation can be adjusted.

In order to be able to change the resonator length, stabilize the operation of the parametric oscillator and optimize the efficiency, an end mirror of the resonator can be mounted on a translation stage or an adequate actuator on which it can be moved along the optical axis of the resonator. To this end, the translation stage may be controlled e.g. piezoelectrically with nanometer precision.

When a dispersion-compensating mirror is provided in the resonator, this mirror will preferably have a reflection bandwidth of at least one octave, i.e. a reflectivity of 99% or more over a frequency range from a first frequency f to the double frequency $2f$. It is thus possible to excite more modes of the laser radiation in the resonator so that the pulse duration of the laser radiation generated will be reduced.

According to one alternative of the present invention, a frequency conversion unit, e.g. a frequency doubler, for converting the frequency of the signal pulse can be provided in the interior of the resonator. While the non-frequency-doubled signal radiation continues to circulate in the resonator, the frequency-doubled radiation may be coupled out of the resonator directly via an output coupler mirror. For the non-frequency-doubled radiation, the reflecting elements of the resonator may then ideally have a reflectivity of 100% so as to prevent losses of signal radiation from the resonator.

The present invention also relates to a method of generating ultra-short laser pulses. According to this method, a coherent pump laser radiation comprising pump photons is directed onto an optically non-linear amplifier crystal arranged in an optical resonator, so that a signal photon and an idler photon are generated from a pump photon in the amplifier crystal by means of an optical parametric process. The signal photons form a signal pulse circulating in the resonator. In addition, the dispersion of the radiation circulating in the resonator is compensated at least partially, but preferybly entirely, by dispersion compensation members. By means of this method a stable pulse laser operation with very short pulse durations, high average powers and a large number of different wavelengths can be achieved.

In order to fulfil the phase matching condition for the optical parametric process and increase the efficiency of said optical parametric process, it may be of advantage when the pump laser radiation falls on the amplifier crystal at an angle relative to the optical axis of the resonator.

A particularly strong amplification of the signal pulse circulating in the resonator will be accomplished, when the arrival of a pulse of the pulsed pump laser radiation at the amplifier crystal is synchronized in time with the arrival of the signal pulse circulating in the resonator at the amplifier crystal. This synchronization can be achieved in that the resonator length leads to a circulating time of the signal pulse which corresponds as precisely as possible to the time interval between two (adjacent or non-adjacent) pulses of the pump laser radiation.

According to one variant of the method according to the present invention, a frequency conversion, in particular frequency doubling, of the signal pulse can be executed within the resonator. As has already been explained, it is thus possible to prevent, in the best of cases, any loss of non-frequency-converted signal radiation from the resonator, while only the frequency-converted part is coupled out.

In the frequency domain, the ultra-short laser pulses generated by the system according to the present invention and the method according to the present invention can be described as mode comb. Arithmetically, the mode or frequency comb can be described as $f_n = f_0 + n\, \Delta f$. $\Delta f$ here is the mode distance of adjacent modes, which corresponds precisely to the pulse repetition frequency, i.e. the repetition rate, of the resonator and which is therefore determined by the optical path length of the pulses in the resonator. The offset frequency $f_0$ results from the fact that the group velocity for the pulses circulating in the oscillator, which determines the repetition rate and consequently the mode distance $\Delta f$, differs from the phase velocity of the individual modes.

In the parametric oscillator according to the present invention and in the method according to the present invention a stabilizer or control circuit may be provided for each of the two degrees of freedom of the frequency comb, i.e. the offset frequency $f_0$ and the mode distance $\Delta f$. Such stabilizers or control circuits are described in DE 199 11 193 A1, EP 1 161 782 B1 or DE 100 44 404 C2. In order to modify the mode distance or adjust it to a predetermined reference value, if a deviation should have been detected, the stabilizer may activate an actuator, which changes the optical path length of the oscillator and thus the pulse repetition frequency. The actuator may e.g. be a linear drive or a piezo actuator for a resonator mirror of the resonator.

In the following, an advantageous embodiment of the invention is explained in more detail making reference to a drawing.

The only FIGURE shows an embodiment of the system according to the present invention or (in the present document used synonymously:) a parametric oscillator 1. A pump laser 2 and a frequency doubler stage 3 together define a pump laser system 4 of the oscillator or system 1 according to the present invention. The pump laser 2 is a mode-locked infrared pump laser. In the frequency doubler stage 3, e.g. a frequency doubler crystal, the frequency of the laser radiation generated by the pump laser 2 is doubled. Optionally, the pump laser system 4 may additionally comprise an amplifier stage. The radiation generated by the pump laser system 4 has an average power of approx. 10 W and a central wavelength of 520 nm. The pulse repetition frequency is approx. 35 MHz, the pulse duration 500 fs.

The coherent pump laser radiation 5 emitted from the pump laser system 4 is deflected via tilted mirrors or pump mirrors 6, 7, which are highly reflecting for the pump laser radiation 5. Beyond the second pump mirror 7, the pump laser radiation 5 passes through a focussing element 8, e.g. a focussing lens. The focussing element 8 concentrates the pump laser radiation 5 in a focus, which is located close to the surface or in the interior of an optically non-linear crystal 9.

The amplifier crystal 9 is located in a resonator 10. The amplifier crystal 9 has a high non-linear susceptibility and is configured for generating, by means of an optical parametric process, a signal photon and idler photon from a pump photon of the pump laser radiation 5 by means of three wave mixing.

A first end mirror M1 of the resonator 10 is connected to an actuator, in particular a piezoelectric actuator, for nanometer precision displacement along the optical axis 11 of the resonator 10. This displacing movement is indicated by a double arrow. A displacement of the end mirror M1 results in a change of the resonator length. This causes a change in the circulating time of the signal pulse in the resonator 10 as well as a change in the mode distance M of the mode comb leaving the parametric oscillator 1.

A second resonator mirror M2 and a third resonator mirror M3 have provided between them the non-linear amplifier crystal 9. The second and third resonator mirrors M2, M3 are configured as concave mirrors so as to focus the signal pulses circulating in the resonator 10 and collimate them when they have passed through the amplifier crystal 9. The focus formed by the two concave mirrors M2, M3 lies in the interior of the crystal 9, in particular at the location of the focus of the pump laser radiation 5 formed by the focussing optics 8. The efficiency of the optical parametric process in the amplifier crystal 9 is increased in this way.

Via a further resonator mirror M4, the signal pulse circulating in the resonator 10 reaches an output coupler mirror OC. A part of the signal pulses circulating in the resonator 10 leaves the resonator 10 through the output coupler mirror OC in the form of ultra-short laser pulses and in the form of a mode comb 12, respectively.

The first four resonator mirrors M1 to M4 are dispersion-compensating mirrors which support bandwidths up to one octave or more, i.e. which have an extremely high reflectivity over a frequency range from a frequency f to at least the double frequency $2f$. In this way, the dispersion-compensating mirrors support the formation of ultra-short laser pulses in the resonator 10. The mirrors M1 to M4 may e.g. be so-called "chirped mirrors" or "double chirped mirrors" or "double chirped mirror pairs".

The fourth resonator mirror M4 and the output coupler mirror OC have a pair of optical wedge substrates provided between them. These optical wedges W1, W2 are arranged at an oblique angle to the optical axis 11 of the resonator 10 and can be displaced in the longitudinal direction along their own main axis. In this way, the wedge substrates W1, W2 serve to finely adjust the dispersion compensation in the resonator 10.

In the embodiment shown, the pump irradiation geometry is non-collinear, i.e., at the amplifier crystal 9, the pump laser radiation 5 falls on the crystal 9 at an angle φ unequal to 0° relative to the optical axis 11 of the resonator 10. The angle serves to accomplish phase matching between the pump laser radiation 5 and the signal radiation leaving the crystal 9 in the direction of the optical axis 11 of the resonator 10. In the present embodiment, in which a BBO crystal is used as an amplifier crystal 9, the angle p is 2.4°.

When the method according to the present invention is executed, or when the parametric oscillator 1 according to the present invention is in operation, the pump laser 2 generates femtosecond laser pulses whose frequency is doubled in the frequency conversion stage 3. The pump laser radiation 5 is directed via the mirrors 6, 7 onto the amplifier crystal 9 at the angle cp relative to the optical axis 11 of the resonator, i.e. in a non-collinear irradiation geometry. In so doing, the pump laser radiation 5 is focussed onto or into the crystal 9 by means of the focussing optics 8.

In the amplifier crystal 9 an optical parametric process takes place. By means of three wave mixing, a signal photon and idler photon are thus formed from a pump photon of the pump laser radiation 5. The higher the efficiency of the optical parametric process is, the more pump photons will be converted into a signal photon and an idler photon.

The signal photons leave the amplifier crystal 9 along the optical axis 11 of the resonator 10. The signal photons form together a broadband, i.e. ultra-short laser pulse circulating in the resonator 10 as a signal pulse. The dispersion of the signal pulse is limited and compensated, respectively, by the dispersion compensation members, in the present embodiment the dispersion-compensating mirrors M1 to M4 and the optical edges W1, W2, so as to prevent the signal pulse from diverging. A part of the signal pulse is coupled out at the output coupler mirror OC as laser radiation 12 in the form of ultra-short laser pulses.

The repetition rate of the pump laser 2 corresponds to the repetition rate of the signal pulse in the resonator 10, which is determined by the optical length of the resonator 10. Alternatively, the repetition rate of the resonator 10 may be an integer multiple of the repetition rate of the pump laser 2. It is thus guaranteed that a pulse of the pump laser radiation 5 will arrive at the amplifier crystal 9 simultaneously with a signal pulse, so as to increase the efficiency of the optical parametric process and so as to amplify the signal pulse still further whenever it passes through the amplifier crystal 9. The position of the end mirror M1 of the resonator 10 can be modified so as to modify the resonator length and thus the repetition rate of the resonator 10, so that this repetition rate can be adapted to the repetition rate of the pump laser 2. It would also be imaginable to make the repetition rate of the pump laser 2 adaptable.

The signal radiation generated by the parametric oscillator 1 according to the present invention in the present embodiment has, in a first example, an average power of approx. 600 mW, a wavelength of 800 nm and a pulse duration of slightly less than 200 fs, e.g. 190 fs. In a second embodiment with particularly broadband amplification, the signal radiation has a pulse energy of 1.4 nJ, an average power of 100 mW, again a central wavelength of 800 nm and a pulse duration of less than 20 fs, e.g. 17.9 fs. When two pulses circulate simultaneously in the resonator 10, the repetition frequency may be 2×35 MHz=70 MHz. When the output coupler mirror OC has a transmissivity of 1%, the radiation intensity at the amplifier crystal 9 may exceed 4 MW/cm$^2$.

Starting from the embodiment shown, the parametric oscillator according to the present invention and the method according to the present invention can be modified in many respects. Instead of a BBO crystal, also some other crystal may be used as a non-linear amplifier crystal 9. Depending on the nature of the crystal 9 used, it would be imaginable to replace the non-collinear irradiation geometry shown by a collinear irradiation geometry, in the case of which the pump laser radiation 5 reaches the amplifier crystal 9 collinearly with the optical axis 11 of the resonator 10.

In addition, it would also be possible to provide a second amplifier crystal of the same type or of a different type in the resonator 10, said second amplifier crystal realizing a second gain stage either by a conventional laser process or by a further optical parametric process. This second amplifier crystal may be pumped by the same pump laser 2, possibly with a different frequency conversion stage, i.e. in the case of frequency-tripled pump laser radiation, by way of example.

Another option is to carry out a frequency conversion of the signal wave within the resonator 10. In this case, a frequency conversion unit, e.g. a frequency doubler crystal, would be provided within the resonator 10. The frequency-doubled signal pulse would be coupled out via the output coupler mirror, whereas 100% of the non-frequency-doubled part of the signal pulse remain in the resonator 10.

As has already been explained, also a stabilizer may be provided for stabilizing one or both degrees of freedom of the mode comb leaving the parametric oscillator 1. The pulse train of the signal or idler photons emitted by the parametric oscillator 1 may be used e.g. as a mode comb for precision frequency metrology.

What is claimed is:

1. A parametric oscillator for generating ultra-short laser pulses, comprising:
    a resonator with an optical axis,
    an amplifier crystal arranged in said resonator, and
    a pump laser system for generating pump laser radiation directed onto the amplifier crystal and comprising pump photons,
    wherein a plurality of dispersion compensation mirrors are provided in the parametric oscillator for compensating, at least partially, the dispersion of the radiation circulating in the resonator, each of the plurality of dispersion compensation mirrors having a reflection bandwidth of at least one octave, and wherein the amplifier crystal is an optically non-linear crystal configured for generating from a pump photon a signal photon and an idler photon by an optical parametric process, and that the resonator is arranged such that a signal pulse including the signal photons leaves the amplifier crystal along the optical axis of the resonator.

2. A parametric oscillator according to claim 1, wherein the amplifier crystal is a BBO crystal.

3. A parametric oscillator according to claim 1, wherein the pump laser radiation is directed onto the amplifier crystal non-collinearly relative to the optical axis of the resonator.

4. A parametric oscillator according to claim 1, wherein the pump laser system comprises a pump laser and a frequency conversion stage.

5. A parametric oscillator according to claim 1, wherein the pump laser radiation is a pulsed laser radiation.

6. A parametric oscillator according to claim 1, wherein a pair of optical wedges, a pair of prisms and/or at least one dispersion-compensating mirror are provided as dispersion compensation members for at least partially compensating the dispersion of the radiation circulating in the resonator.

7. A parametric oscillator according to claim 1, wherein a frequency conversion unit for converting the frequency of the signal pulse is provided in the interior of the resonator.

8. A parametric oscillator according to claim 1, wherein at least one stabilizer is provided for stabilizing the offset frequency $f_0$ and/or the mode distance $\Delta f$ to external or internal references.

9. A parametric oscillator according to claim 1, wherein the emitted pulse train of the signal photons or idler photons is used as a mode comb for precision frequency metrology.

10. A method of generating ultra-short laser pulses, comprising
directing a coherent pump laser radiation comprising pump photons onto an optically non-linear amplifier crystal arranged within an optical resonator, so that a signal photon and an idler photon are generated from a pump photon in the amplifier crystal by means of an optical parametric process,
wherein a signal pulse circulating in the resonator is formed from the signal photons, and
wherein a dispersion of the radiation circulating in the resonator is compensated at least partially by a plurality of dispersion compensation mirrors, each of the plurality of dispersion compensation mirrors having a reflection bandwidth of at least one octave.

11. A method according to claim 10, wherein the pump laser radiation falls on the amplifier crystal at an angle ($\phi$) relative to the optical axis of the resonator.

12. A method according to claim 10, wherein the arrival of a pulse of the pulsed pump laser radiation at the amplifier crystal is synchronized in time with the arrival of the signal pulse circulating in the resonator at the amplifier crystal.

13. A method according to claim 10, wherein a frequency conversion of the signal pulse is executed within the resonator.

14. A method according to claim 13, wherein the frequency conversion comprises a frequency doubling.

15. A parametric oscillator according to claim 1, wherein the plurality of dispersion compensation mirrors comprise at least four dispersion compensation mirrors.

16. A parametric oscillator according to claim 1, wherein the plurality of dispersion compensation mirrors are selected from the group consisting of chirped mirrors, double-chirped mirrors, and double-chirped mirror pairs.

* * * * *